United States Patent [19]

DeVries

[11] Patent Number: 4,485,364
[45] Date of Patent: Nov. 27, 1984

[54] REFLECTION-COMPENSATED SURFACE ACOUSTIC WAVE TRANSDUCER

[75] Inventor: Adrian J. DeVries, Richland, Wash.

[73] Assignee: Zenith Electronics Corporation, Glenview, Ill.

[21] Appl. No.: 495,376

[22] Filed: May 17, 1983

[51] Int. Cl.$^3$ .................. H03H 9/64; H03H 9/145
[52] U.S. Cl. .................. 333/194; 310/313 C; 310/313 D; 333/154; 333/196
[58] Field of Search .................. 333/150–155, 333/193–196; 310/313 R, 313 A, 313 B, 313 C, 313 D

[56] References Cited

U.S. PATENT DOCUMENTS

| | | | |
|---|---|---|---|
| 3,663,899 | 5/1972 | Dieulesaint et al. | 310/313 C |
| 4,007,433 | 2/1977 | Houkawa et al. | 333/196 |
| 4,201,964 | 5/1980 | Noro et al. | 333/151 |

Primary Examiner—Marvin L. Nussbaum

[57] ABSTRACT

An echo-compensating surface acoustic wave interdigital transducer in which the entire length of the end finger of the transducer at each end is connected directly or indirectly to at least one of the bus bars, the end finger extends only partially across the aperture of the transducer, and the space which is colinear with the end finger across the remaining portion of the aperture is not occupied by any surface-acoustic-wave-reflective structure. The end finger is substantially a quarter of an acoustic wavelength out of phase with the nearest interior finger with respect to an incident wave at the operating frequency of the transducer, so that the acoustic reflections of the end finger and the nearest interior finger are in phase-opposition to each other. In addition, the end finger spans one half of the transducer aperture, and is arranged to permit unobstructed acoustic reflection from the nearest interior finger over the other half of the aperture at one of the ends of the transducer, so that the resulting phase-opposed reflections are equal in amplitude in order to achieve mutual cancellation.

10 Claims, 4 Drawing Figures

REFLECTION-COMPENSATED SURFACE ACOUSTIC WAVE TRANSDUCER

This invention relates to surface acoustic wave devices, particularly interdigital transducers such as are used in TV broadcast filters.

BACKGROUND OF THE INVENTION

Surface acoustic wave devices have excellent frequency selectivity, and therefore have earned wide acceptance for use in filters for commercial television receivers. Such filters commonly employ at least two acoustically coupled interdigital transducers mounted upon a common piezoelectric substrate, one for sending an acoustic signal and another for receiving it. Often the two transducers are located in different acoustic track areas on the surface of the substrate, and a multistrip coupler is employed to divert the signal from track to track, so as to avoid detecting bulk reflections traveling through the depth of the substrate. Otherwise such reflections would appear in the output of the transducer, and degrade its performance.

But even after the bulk mode reflections have been eliminated from the filter output, there is a still a problem with surface mode acoustic reflections. Part of the signal emitted by the sending transducer is reflected by the receiving transducer, and thus returns to the sending transducer, where it is again partly reflected. The second reflection travels forward to the receiving transducer, arriving out of phase. This so-called triple-transit produces troublesome ghost images on the screen of a TV receiver. As a result, numerous stratagems have been evolved to deal with the problem of unwanted surface acoustic wave reflections, and a large literature has accumulated on the subject of compensating for such reflections.

The stratagems adopted by the prior art have been successful to a point, but the problem has not been entirely eliminated. The underlying concept in most of the corrective schemes is to generate two reflections which are out of phase with each other, and so tend more or less to cancel each other. Sometimes the phase difference is obtained by electrically connecting reflecting elements in phase-opposition, while in other instances it is the spacing of these elements from each other which causes their reflections to be out of phase.

One scheme of the latter variety which has been almost universally adopted is the use of "split-connected" finger structures in which each finger is subdivided into two electrically interconnected halves spaced a quarter wavelength apart, so that they provide two separate reflections which are opposite in phase and equal in magnitude, and thus substantially cancel each other. Even the use of split-connected fingers, however, leaves higher order reflections to be dealt with by other means.

The present invention is aimed at compensating or cancelling those higher order reflections which continue to be a problem even in transducers which employ the split-finger design.

One prior art approach, described in U.S. Pat. No. 4,205,280, uses an electrically induced phase difference. In that patent an interdigital transducer has a finger which comprises an electrically isolated element and an electrically connected element colinear therewith. The electrical differences between these two elements cause their respective reflections to be out of phase with each other, despite the fact that their colinear location would otherwise cause the reflections to be in phase.

The present invention is superficially similar to the structure of the prior patent, in that it dispenses with a portion of the end finger at one end of the transducer, but in this case that finger portion is eliminated entirely, instead of being merely electrically isolated and remaining present as a reflecting element. As a result, the mode of operation is entirely dissimilar and the degree of reflection compensation achieved is substantially greater.

According to this invention, there is provision for electrically connecting the end finger to a bus bar. The end finger is substantially a quarter of an acoustic wavelength out of phase with the nearest interior finger with respect to an incident wave at the operating frequency, so that the acoustic reflections of the end finger and the nearest interior finger are in phase-opposition to each other. In addition, the end finger spans one half of the transducer aperture, and is arranged to permit unobstructed acoustic reflection from the nearest interior finger over the other half of the aperture at one of the ends of the transducer, so that the resulting phase-opposed reflections are equal in amplitude in order to achieve mutual cancellation.

The reflection-compensating finger employed herein, unlike that in the cited patent, is not electrically isolated. On the contrary, it is tied to at least one of the bus bars. Moreover that finger, unlike the colinear isolated and connected reflecting elements in the cited patent, covers only half of the transducer aperture, leaving the neighboring finger "bare" over the remaining half of the aperture, so that the two halves of the transducer reflect out-of-phase waves, and also so that these reflected waves are of substantially equal amplitude for near total cancellation.

The most fundamental difference, however, between the design of this invention and that of the prior art is only evident at the deepest level of their respective theories of operation. There are several underlying mechanisms at work in the production of surface acoustic reflections from transducers. One of these is mass loading; i.e. the inertial load which the mass of the conductive finger material imposes upon the surface layer of the piezoelectric substrate. A second mechanism is the local short-circuiting effect which the conductive elements have upon the voltages piezoelectrically induced in the substrate material. A third reflection mechanism is due to the interconnection of the two halves of each split finger by the bus bars, as a result of which each split finger becomes a short-circuited current loop, and that disturbs an incoming acoustic wave sufficiently to cause reflections.

In the interior of the transducer each of these reflection-producing mechanisms is opposed by an inherent compensation effect: for each element which produces a reflection, one can find an adjoining element which produces an equal and opposite reflection and therefore theoretically (i.e., when the transducer as a whole is short-circuited) cancels the reflection from the other element. That is not true, however at the ends of the transducer, where the acoustic signal enters and exits. Thus, each of these underlying reflection mechanisms described above is effective in producing reflections primarily at the entrance and exit ends of the transducer.

Therefore, when an acoustic signal wavefront traverses a transducer there is a first transient reflection when the signal hits the first finger (for the first two of the reflection mechanisms described above) or the first finger pair (for the third mechanism described) at the entrance end of the transducer; and when it exits, there is a second, similar transient reflection when the signal hits the last finger or finger pair. It is only when the wavefront is traversing the interior of the transducer structure that the reflection-compensating mechanisms are effective for the three reflecion mechanisms described.

It is an objective of this invention to compensate for these entrance and exit end transients. The prior art structure described herein is capable of doing so only with respect to the reflections produced by the third mechanism, but the present invention is capable of doing so with respect to all three of the described mechanisms, with a resulting improvement in echo suppression of almost an order of magnitude.

These and other features, objects and advantages of the invention will now be more fully described in connection with a particular embodiment. This embodiment serves to illustrate the invention, but the invention is not limited thereto. The detailed description of this illustrative embodiment is intended to be read in conjunction with the following drawings, in which like reference characters refer to like elements throughout the several figures:

DETAILED DESCRIPTION OF THE PREFERRED EMBODIMENTS

Figure 1:
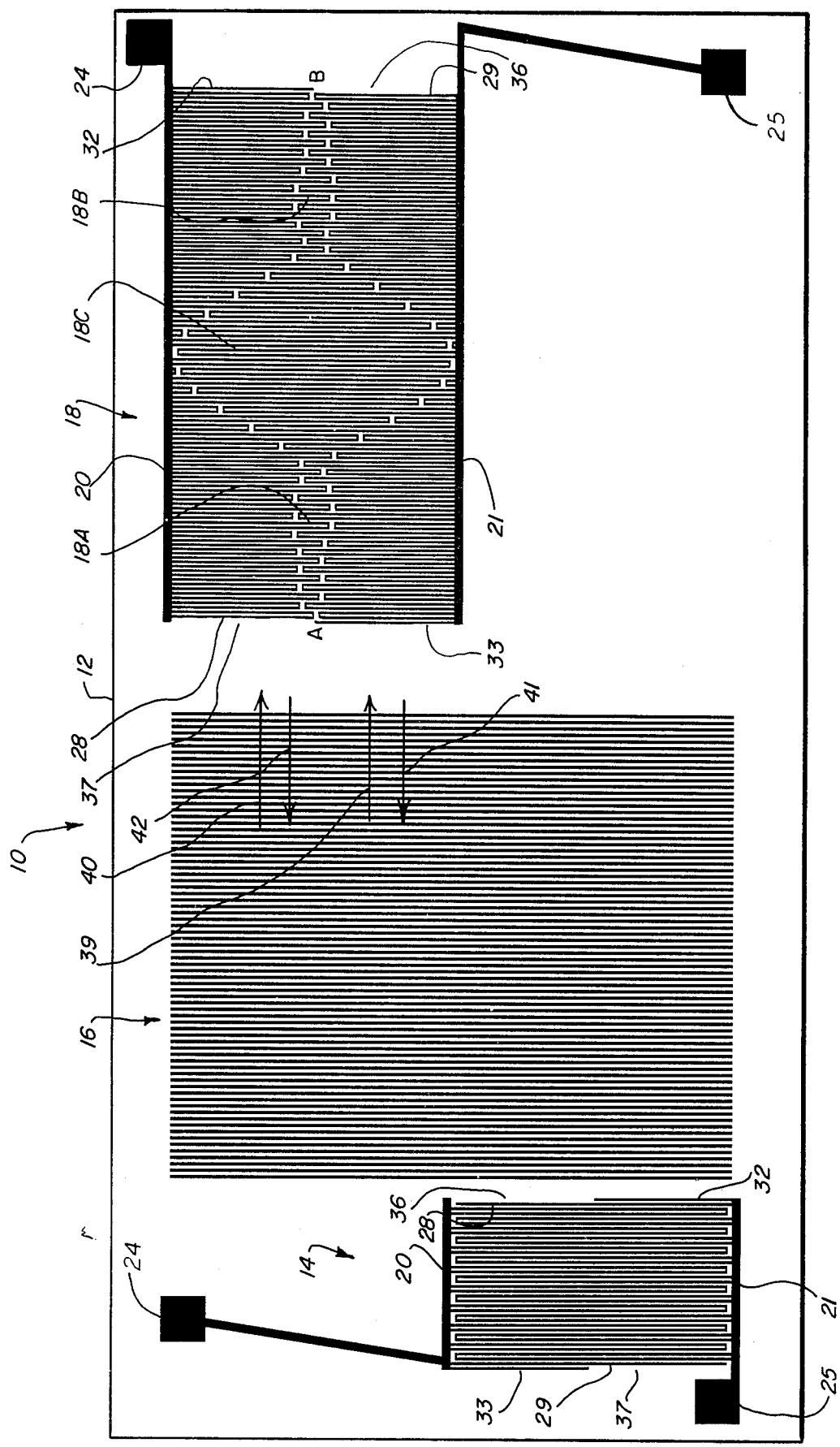
FIG. 1 is a top plan view of a surface wave acoustic filter incorporating two interdigital transducers, one of uniform finger length and one which is apodized, or finger-length-weighted, which are both constructed in accordance with this invention.

FIG. 1 depicts a surface acoustic wave filter 10 which is in some respects of conventional construction. For example, it is formed upon one surface of a piezoelectric substrate 12 by the deposition of conductive metallic elements designed to form a sending interdigital transducer 14, a multi-strip coupler 16, and a receiving interdigital transducer 18. The sending and receiving transducers are located on different tracks, i.e. opposite halves of the substrate surface, so as to avoid bulk mode reflection coupling between them.

The multi-strip coupler serves to translate acoustic signals laterally from the track of the sending transducer to that of the receiving transducer, so as to maintain coupling between the transducers with respect to surface acoustic signals, although they remain decoupled with respect to bulk mode reflections. Unfortunately, the multi-strip coupler also transfers unwanted surface mode reflections from track to track, in either direction, just as efficiently as it does the desired surface acoustic signal. It is effective in discriminating against bulk mode reflections, but it cannot tell the difference between a surface mode signal and a surface mode reflection.

In the usual manner, each of the interdigital transducers comprises a pair of electrically opposed bus bars 20 and 21 which are connected to respective opposite electrical terminals 24 and 25. Interior fingers 28 and 29 extend in mutually parallel relationship from the opposed bus bars 20 and 21 respectively, and are interdigitated (i.e. their lengths overlap) so as to produce the electro-acoustic interaction for which such devices are known. The spacing between the fingers is one quarter wavelength (at the operating frequency of the filter).

Most of the interior fingers 28 and 29 are of the usual split configuration, actually consisting in effect of two adjacent but separate half-fingers a quarter wavelength apart (at the center frequency of the filter), extending from a common bus bar 20 or 21, and also connected together at the ends remote from their common bus bar.

Another conventional aspect of this filter is the fact that the receiving transducer 18 is apodized, or finger-length-weighted, to tailor its frequency response characteristics to the particular filter application. Thus the lengths of the interior fingers 28 and 29 of the latter transducer vary along the length of the longitudinal transducer axis AB so that the active, interdigitated area of the transducer is divided roughly into a central major lobe 18C and a number of minor lobes such as 18A and 18B on either side of the major lobe.

In accordance with this invention, however, a novel structural feature is introduced into each of the transducers 14 and 18: at one end of each of these transducers is an electrically connected, unsplit end finger 32 extending from bus bar 20 in a direction parallel to interior fingers 28 and 29 to a point halfway across the aperture of the transducer; while at the other end is another electrically connected unsplit end finger 33 extending from bus bar 21 also in a direction parallel to interior fingers 28 and 29 to a point halfway across the aperture of the transducer. No other finger is colinear with any of the end fingers 32 or 33; that is, the locations 36 and 37 which are colinear with the end fingers 32 and 33 respectively are empty substrate areas devoid of any metallic fingers. The end fingers 32 and 33 are, like the interior fingers, spaced one quarter wavelength (at the operating frequency of the filter) from their respective nearest neighbors.

As the term is used herein, an "end finger" is one which which is located at either the entrance or exit end of its transducer, and has no neighboring fingers on one side thereof. The "aperture" of a transducer is defined as the distance, in a direction transverse to the transducer's longitudinal axis AB, over which the electrically opposed interior fingers 28 and 29 thereof are interdigitated, i.e. the active breadth of the transducer. In the case of an apodized device such as transducer 18, the "aperture" is considered to be the maximum interdigitated distance, i.e. the peak breadth of the major active lobe 18C. In this invention the end fingers 32 and 33 extend halfway across the apertures of their respective transducers.

It should also be noted that the end fingers are electrically tied to the instantaneous voltages of their respective bus bars 20 and 21. In the above-cited prior art patent a similarly located finger is employed for echo compensation. But in that case a portion of that finger is electrically isolated, rather than having a definite voltage, and another portion thereof which has a definite voltage is colinear with the isolated finger portion, and these two portions toghether extend across nearly the entire transducer aperture. These structural divergences result in important differences in the mechanism of echo suppression and the degree of success achieved.

An understanding of the difference in mode of operation requires an explanation of the respective theories of operation of these two devices. As explained in the cited prior art patent, the operation of that device depends upon the assumption that a surface acoustic wave reflection bouncing off an electrically isolated finger portion will be 180' out of phase with a surface acoustic wave reflection bouncing off another finger portion which is electrically connected to a bus bar, when the two finger portions are colinear so that they are in the same phase relationship to the incident wave. These two out-of-phase reflections tend to cancel each other. Notice that colinearity and electrical isolation are fundamentally important aspects of the operation of the prior art device. Notice also that the echo cancellation effect depends upon the electrical disparity (connected vs. isolated) between the two finger elements, rather than upon a acoustic path length differential; since they are colinear, the acoustic paths are equal.

In contrast, the echo cancellation effect of the present structure depends upon a differential between acoustic path lengths. With reference to FIG. 1, suppose an incident surface acoustic wave, represented by arrows 39 and 40, impinges upon one end (the entrance end) of receiving transducer 18. Arrow 39 represents that portion of the incident wave which impinges upon the end finger 33 at the entrance end of transducer 18, while arrow 40 represents that portion of the incident wave which impinges upon the first interior finger 28 at that same end of the transducer. Since the end finger 33 extends across half of the aperture of the transducer, the incident wave is divided equally between arrows 39 and 40. Arrow 41 represents the reflection which results from finger 33, while arrow 42 represents the reflection from finger 28 at the entrance end of the receiving transducer. Since the signals represented by arrows 39 and 40 are equal in amplitude, and since the structures they encounter have the same topography except for a quarter wavelength difference in location, the reflections represented by arrows 41 and 42 are also equal in amplitude. Since the fingers 33 and 28 are separated by a distance of one quarter wavelength along the transducer axis AB, there is a half wavelength difference between the total incident and reflected path length traveled by wave 39, 41 and the total incident and reflected path length traveled by wave 40, 42. Therefore the reflections 41 and 42 are equal in amplitude and 180 degrees out of phase with each other, which is the relationship required for cancellation.

Note that in this device the fingers 28 and 33 at the entrance end of the transducer must not be colinear, as in the prior art, because the principle of operation requires these fingers to be a quarter wavelength apart. Note also that, in order for the phase difference between the reflections 41 and 42 to be entirely a function of the acoustic path length differential, and not affected by electrical polarity or isolation, both fingers 28 and 33 at the entrance end of the transducer are electrically tied to their respective bus bars, and neither one of them is electrically floating, as in the prior art.

The reason for also providing a similar end finger 32 at the exit end of transducer 18, and similar end fingers 32 and 33 at the opposite ends of transducer 14, may be understood by probing deeper into the theory of operation of this device. In actuality, each finger (and each half of each split finger) of each transducer produces its own reflection. But since the two halves of each split finger are a quarter wavelength apart, their reflections tend to cancel each other, for path-length-differential reasons. Therefore, relatively little reflection occurs as a result of a wave front's passage through the interior of a transducer. Instead, most of the reflection results from uncompensated boundary effects occurring at the entrance and exit ends of the transducers.

For the first transit wave, the signal from sending transducer 14 enters receiving transducer 18 at the entrance end (where end finger 33 is located) and is partly reflected back from that end. As the unreflected portion of the signal proceeds through the receiving transducer to the exit end (where end finger 32 is located), it is partly reflected back from that end also.

The first reflections from both ends of transducer 18 travel back to transducer 14, entering it at the end where end finger 32 is located, and exiting from it at the end where end finger 33 is located. These first reflections are then re-reflected, once from each end of the transducer 14, forward toward transducer 18 again.

Accordingly, the present invention employs an end finger for reflection compensation at each end of each transducer. The mechanism by which reflection compensation occurs at each location is the same as that explained above for the entrance end of receiving transducer 18.

The means by which the present invention produces echo compensation has been shown to be fundamentally different from that exploited by the prior art "floating finger" patent. In addition, measurements made on both structures suggest that almost an order of magnitude improvement can be obtained by means of the present invention.

The explanation for such a surprising improvement may lie in an analysis of the fundamental mechanisms responsible for surface acoustic reflections which are described above. The first mechanism, mass loading, is not eliminated by the prior art technique of floating half a finger, because substantially all the mass of the floating half finger remains. The second mechanism, local short circuiting, is likewise not affected by floating half a finger, because the finger material is still there to provide a conductive path between different voltage points on the substrate. In other words, the assumption of the prior art patent, that the reflection from a floating finger will be 180 degrees out of phase with the reflection from a connected finger, is not borne out with respect to these two mechanisms. Only the circulating current effect is affected by the floating finger technique, because disconnecting the floating finger from a bus bar does interrupt the circulating current path.

The approach of the present invention, however, compensates for the reflections produced by all three of these mechanisms, because the assumption that reflections from the two opposite halves of the transducer aperture will have 180' different path lengths is always true, regardless of the fundamental mechanism by which the reflection is produced. The result, according to empirical observations, is a surprising degree of improvement in echo suppression. Because of this invention, therefore, superior filters producing a more ghost-free television image are possible.

In the foregoing discussion, the theory of operation was described in connection with transducer 18, considered as a receiver, while transducer 14 was viewed as the transmitter. But it is demonstrable that the same theoretical mechanisms of echo suppression operate when the improvement of this invention is incorporated into the transmitting transducer 14.

Figure 2:
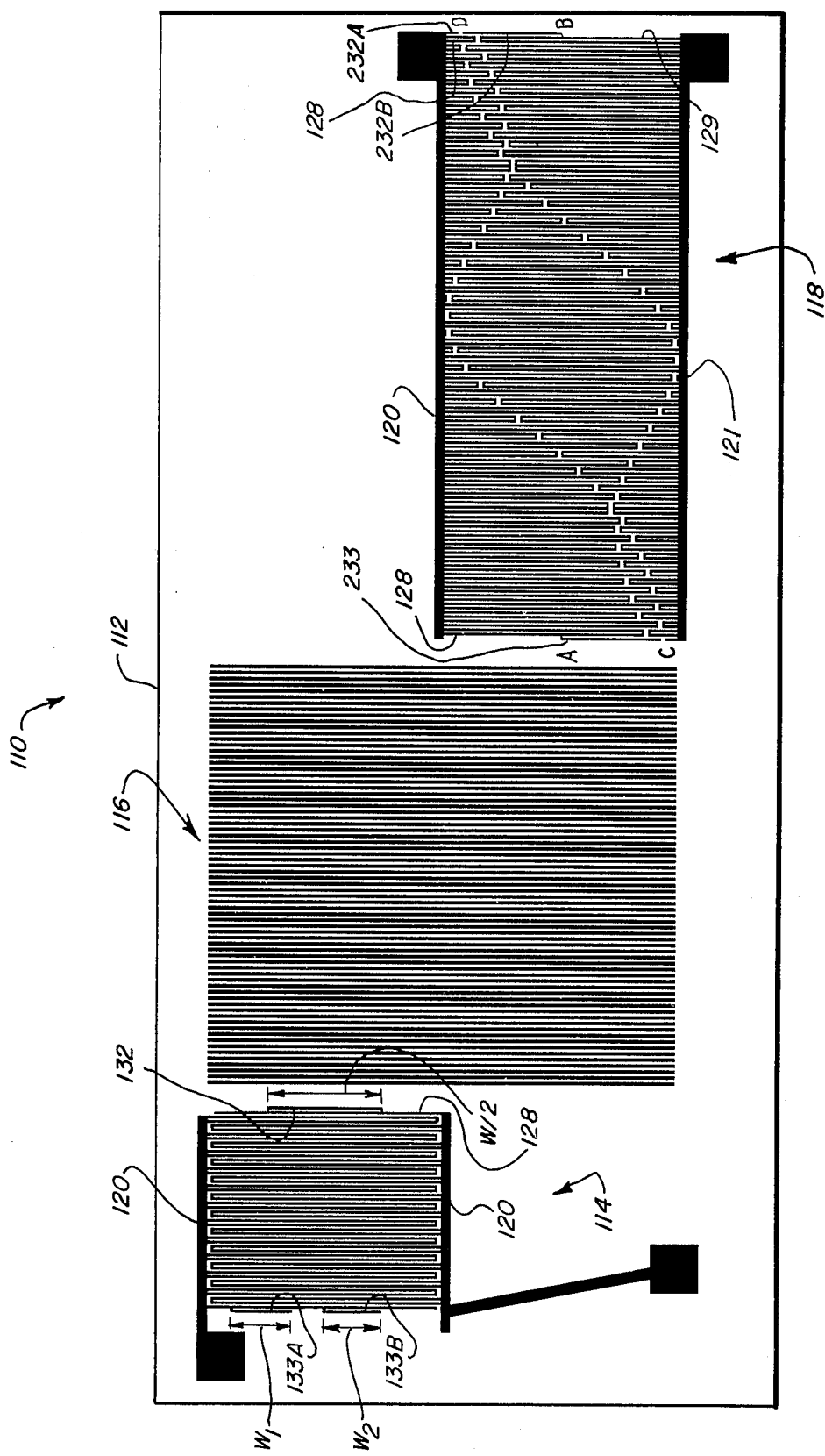
FIG. 2 is a similar view of a similar surface wave acoustic filter in which somewhat different forms of the uniform-finger-length and finger-length-weighted transducers are employed.
Figure 4:
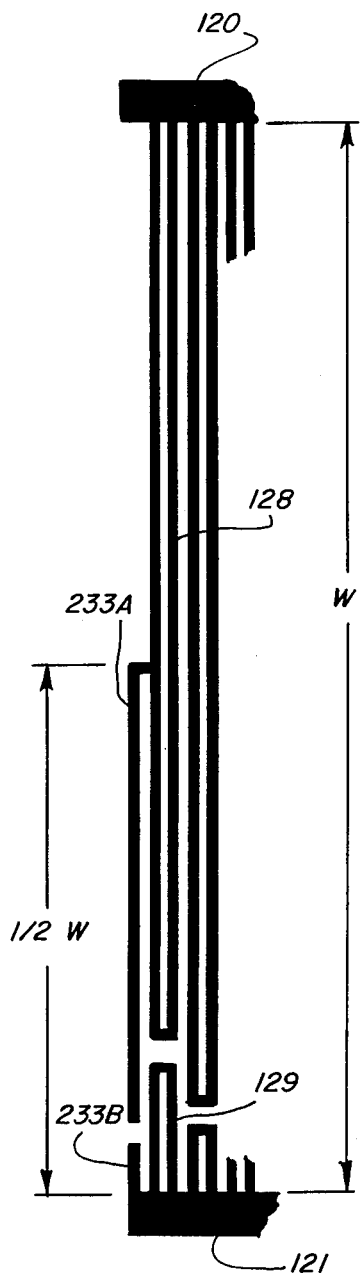
FIG. 4 is an enlarged detail view of the entrance end of the finger-length-weighted transducer of FIG. 2.
Figure 3:
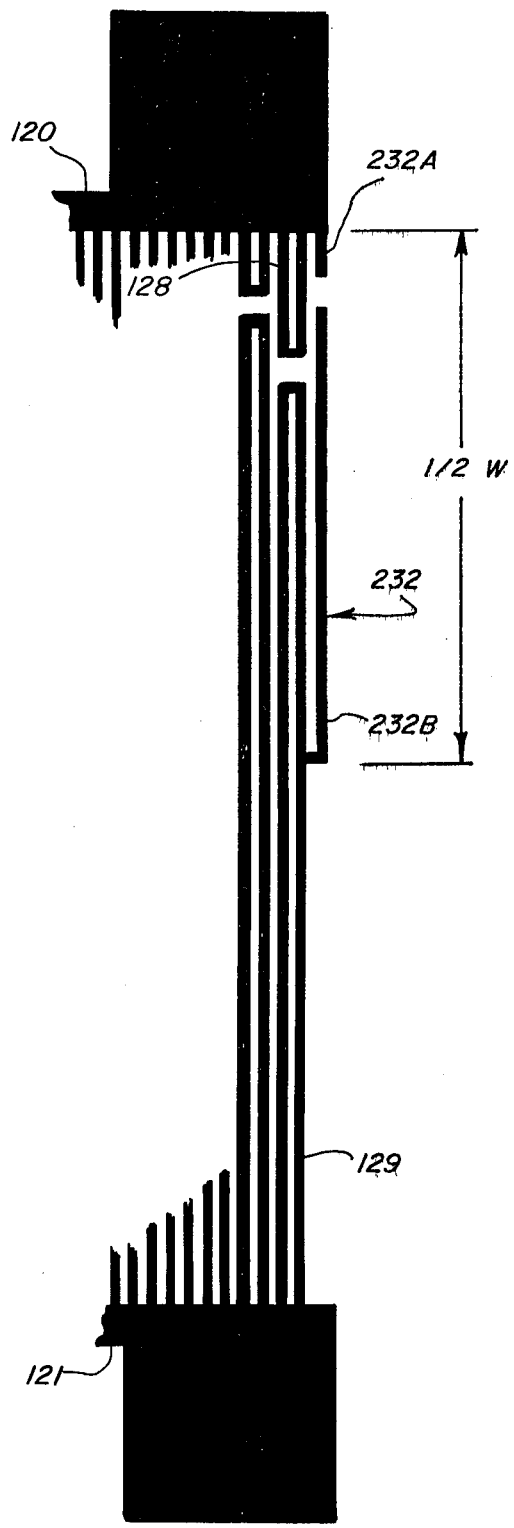
FIG. 3 is an enlarged detail view of the exit end of the finger-length-weighted transducer of FIG. 2.

FIGS. 2 through 4 illustrate some of the structural variations of the invention, which however operate in the same manner as the embodiment of FIG. 1 explained above. FIG. 2 illustrates a transducer 110 comprising a piezoelectric substrate 112 on a surface of which are formed a sending transducer 114, a multistrip coupler 116, and an apodized receiving transducer 118. In this embodiment, however, the axis of apodization CD is not coincident with the longitudinal transducer axis AB, but is at an angle to it.

In order to point out that the placement of the end fingers is not important, the end finger 132 of the sending transducer 114 is not confined to one side of the transducer aperture, i.e. it is not adjacent to bus bar 120 nor to bus bar 121 thereof. Although it is necessary for effective echo cancellation that the length W/2 of the end finger be equal to one half the transducer aperture W, its location need not be confined to one half of the transducer.

Since the end finger 132 is not within connecting distance of either of the bus bars 120 or 121, however, it is necessary to find another way to connect it to a definite potential reference. In the embodiment of FIG. 2 this is accomplished by connecting the end finger 132 to the nearest interior finger 128 at both ends as illustrated, or only at one end if preferred.

Another type of end finger is illustrated by finger 133 at the other end of transducer 114. This one is divided into two segments 133A and 133B, in order to demonstrate that the end finger need not be continuous, so long as the combined lengths of all the segments equals half the transducer aperture; i.e. in this case $W1 + W2 = W/2$.

Still another type of end finger, exemplified by fingers 232 and 233 of transducer 118, is required to accommodate the asymmetric apodization pattern thereof. These, however, are best seen in the enlarged detailed views of FIGS. 3 and 4 respectively.

In FIG. 3 it is seen more clearly that, because of the asymmetry of the apodization pattern, the division between the opposite polarity fingers (short finger 128 and long finger 129) is much closer to one side of the transducer than the other, i.e. closer to bus bar 120 than to bus bar 121. Therefore the end finger 232, since it extends from bus bar 120 halfway across the transducer aperture, overlaps all of the neighboring short finger 128 extending from bus bar 120 plus a portion of the neighboring long finger 129 which extends from the opposite bus bar 121. In order to avoid disrupting the apodization pattern, this necessitates that the end finger 232 be divided into two segments 232A and 232B which are electrically connected to opposite sides of the transducer. Segment 232A is connected to bus bar 120, while segment 232B is connected to finger 129 which in turn is connected to bus bar 121.

Similarly in FIG. 4 the end finger 233 is divided into a longer segment 233A which is electrically connected to finger 128 and through the latter to bus bar 120, and a shorter segment 233B which is connected directly to bus bar 121.

Thus it will be realized that, while it is necessary for the end fingers 232 and 233 of transducer 118 to be connected to some definite potential, it is not necessary that all segments thereof be at the same potential.

It should also be observed that the half aperture length requirement for end fingers is met when the total length of segment 232A plus segment 232B is equal to W/2, and similarly for the total length of segment 233A plus segment 233B.

In any of these embodiments, the invention not only accomplishes echo suppression in a way which is different from the approaches taken by the prior art, but also achieves a significant and surprising degree of improvement thereover.

The foregoing detailed description specifies an embodiment which is presently preferred, and which serves to illustrate this invention. But other embodiments may be imagined now or in the future which may incorporate one or more aspects of the invention. Therefore the scope of protection accorded should not be limited to the particulars of this description, but instead should be determined by the following claims. These claims, moreover, should be interpreted consistently with the general principles and novel teachings expressed herein.

The invention claimed is:

1. A reflection-compensated surface acoustic wave interdigital transducer designed to operate at a selected operating frequency and being of the type having a pair of bus bars, and interdigitated finger means connected to respective ones of said bus bars, and defining an axial direction toward which a surface acoustic signal may be emitted or from which it may be received, at least one end at which such a signal may enter said transducer or exit therefrom, and a maximum effective signal-receiving or signal-emitting aperture extending in a direction transverse to said axial direction, wherein:

the entire length of the end finger means of said transducer at said one end is connected directly or indirectly to at least one of said bus bars;

said end finger means extends only partially across said aperture, the space which is colinear with said end finger across the remaining portion of said aperture is substantially unoccupied by any surface-acoustic-wave-reflective structure;

and said end finger means is so positioned that an axially impinging surface acoustic wave at said operating frequency produces surface acoustic reflections therefrom which are substantially half an acoustic wavelength out of phase with surface acoustic reflections which said wave produces from the nearest other finger means, whereby their respective acoustic reflections are in phase-opposition to each other.

2. A transducer as in claim 1 wherein said end finger means spans substantially one half of said transducer aperture, whereby said phase-opposed reflections are substantially equal in amplitude in order to achieve substantial mutual cancellation.

3. A transducer as in claim 2 having two of said ends, and wherein there is one of said end finger means at each of said ends of said transducer.

4. A transducer as in claim 2 wherein said end finger means comprises a finger bar formed of conductive material extending from one of said bus bars, and located outwardly of said nearest other finger means at said end of said transducer, and positioned substantially said quarter wavelength therefrom.

5. A transducer as in claim 2:
wherein said end finger means comprises at least one finger bar formed of conductive material located between said bus bars, and outwardly of said nearest other finger means, and substantially said quarter wavelength from said nearest other finger means;

and further comprising means electrically connecting said finger bar to said nearest other finger means.

6. A transducer as in claim 5 wherein;

said end finger means comprises a plurality of finger bars formed of conductive material each located between said bus bars, and outwardly of said nearest other finger means, and positioned substantially said quarter wavelength from said nearest other finger means;

said connecting means being arranged to electrically connect each of said finger bars to said nearest other finger means;

the sum of the lengths of said finger bars being substantially equal to half of said transducer aperture.

7. A transducer as in claim 2 wherein said other finger means are of uniform length.

8. A transducer as in claim 2 wherein said other finger means are length-weighted to form an active interdigitated area and an inactive non-interdigitated area, whereby to optimize the frequency response of said transducer at said selected frequency.

9. A transducer as in claim 8 wherein the longitudinal axis of said active area is substantially coincident with said longitudinal axis of said transducer.

10. A transducer as in claim 8 wherein the longitudinal axis of said active area is at a substantial angle to said longitudial axis of said transducer.

* * * * *